US008232609B2

(12) United States Patent
Kunii et al.

(10) Patent No.: US 8,232,609 B2
(45) Date of Patent: Jul. 31, 2012

(54) SEMICONDUCTOR DEVICE INCLUDING FIELD EFFECT TRANSISTOR WITH REDUCED ELECTRIC FIELD CONCENTRATION

(75) Inventors: Tetsuo Kunii, Tokyo (JP); Hirotaka Amasuga, Tokyo (JP); Yoshitsugu Yamamoto, Tokyo (JP); Youichi Nogami, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 174 days.

(21) Appl. No.: 12/828,328

(22) Filed: Jul. 1, 2010

(65) Prior Publication Data

US 2011/0006351 A1 Jan. 13, 2011

(30) Foreign Application Priority Data

Jul. 13, 2009 (JP) ................................ 2009-164450

(51) Int. Cl.
*H01L 29/76* (2006.01)

(52) U.S. Cl. ........ 257/401; 257/155; 257/296; 257/379; 257/409; 257/473; 257/532; 257/E27.016; 257/E27.06

(58) Field of Classification Search .................. 257/401, 257/409, 155, 296, 379, 473, 532, E27.016, 257/E27.06
See application file for complete search history.

(56) References Cited

U.S. PATENT DOCUMENTS 4,982,247 A 1/1991 Aoki et al.
5,598,010 A * 1/1997 Uematsu ......................... 257/48
7,595,537 B2 * 9/2009 Kodama et al. ............... 257/409
2005/0253167 A1 11/2005 Wu et al.

FOREIGN PATENT DOCUMENTS

| | | | |
|---|---|---|---|
| CN | 2510997 | Y | 9/2002 |
| JP | 59-224174 | A | 12/1984 |
| JP | 60-231370 | A | 11/1985 |
| JP | 3-145736 | A | 6/1991 |
| JP | 8-330332 | A | 12/1996 |
| WO | WO 2005/114747 | A2 | 12/2005 |

OTHER PUBLICATIONS

State Intellectual Property Office of the People's Republic of China, First Examination Report in Chinese Patent Application No. 2010102269349 (Feb. 13, 2012).

* cited by examiner

*Primary Examiner* — Andy Huynh
(74) *Attorney, Agent, or Firm* — Leydig, Voit & Mayer, Ltd.

(57) ABSTRACT

A semiconductor device includes: a semiconductor substrate; an impurity-doped region at a top surface of the semiconductor substrate; an insulating region located around the impurity-doped region on the top surface of the semiconductor substrate; a gate electrode on the impurity-doped region; a first electrode and a second electrode located on the impurity-doped region, sandwiching the gate electrode; a first pad located on the insulating region and connected to the gate electrode; a second pad facing the first pad across the impurity-doped region, on the insulating region, and connected to the second electrode; and a conductor located between the first electrode and the second pad on the insulating region.

18 Claims, 13 Drawing Sheets

26
18
24
22
12
46
48
44
38
42
14
10
50
54
52

SEMICONDUCTOR DEVICE INCLUDING FIELD EFFECT TRANSISTOR WITH REDUCED ELECTRIC FIELD CONCENTRATION

BACKGROUND OF THE INVENTION

1. Field of the Invention

The present invention relates to a semiconductor device having an insulating region formed through the aforementioned ion injection, and in particular to a semiconductor device which can prevent a breakdown from occurring in the insulating region without increasing a leak current.

2. Background Art

As a semiconductor device having a field-effect transistor, a first semiconductor device is conventionally known, which has a structure in which a plurality of source electrodes, a plurality of gate electrodes and a plurality of drain electrodes are provided in an impurity-doped region provided on a top surface side of a semiconductor substrate, a gate pad and a source pad are provided on the side of one end of the impurity-doped region on the semiconductor substrate and a drain pad is provided opposite to the gate pad across the impurity-doped region on the semiconductor substrate (e.g., see Japanese Patent Laid-Open No. 8-330332).

SUMMARY OF THE INVENTION

In the first semiconductor device, the plurality of gate electrodes are combined into one piece through gate wiring outside the impurity-doped region and connected to the gate pad. Likewise, the plurality of drain electrodes are connected to the drain pad. The plurality of source electrodes are connected to the source pad through source wiring disposed above the gate wiring via an insulating film or air. Furthermore, an insulating region for electrically separating between the drain pad and source pad, and impurity-doped region is provided on the top surface side of the semiconductor substrate.

In the first semiconductor device, the above described insulating region may be formed by injecting ions such as $B^+$, $H^+$, He, O into an impurity-doped layer called a “channel layer” or “cap layer” formed on the semiconductor substrate using an epitaxial method.

Furthermore, a second semiconductor device is known, which has an insulating region electrically separating between a plurality of elements provided on a semiconductor substrate, between the elements provided on the semiconductor substrate and the via holes provided on the semiconductor substrate or between the plurality of via holes provided on the semiconductor substrate. The insulating region of the second semiconductor device may also be formed by injecting ions into an impurity-doped layer.

When the aforementioned first semiconductor device is operated as an amplification element, to efficiently exploit higher performance, it is necessary to apply a higher voltage between the drain electrode and the gate electrode. Therefore, to secure reliability of the first semiconductor device as the amplification element, it is important to secure a sufficient withstand voltage between the source electrode and the drain electrode and between the gate electrode and the drain electrode.

When a higher voltage is applied between the drain electrode and the gate electrode, a gate depletion layer spreads over the impurity-doped region. This causes an electric field to be concentrated in the vicinity of the gate electrode in the gate depletion layer. Thus, in the impurity-doped region, it is possible to prevent a voltage applied between the drain electrode and the source electrode from concentrating in the vicinity of the drain electrode and in the vicinity of the source electrode. Thus, to secure reliability of the first semiconductor device as the amplification element in the impurity-doped region, it is only necessary to secure the withstand voltage of the region in which the gate depletion layer is formed.

On the other hand, the insulating region formed through the aforementioned ion injection maintains a sufficient withstand voltage when the first semiconductor device is operating while being kept at room temperature. However, when the temperature of the impurity-doped region rises due to heat generation through the operation of the first semiconductor device or when the first semiconductor device operates in a high temperature environment, a current may flow between the source electrode and the drain pad via the insulating region. In this case, the voltage applied between the source electrode and the drain pad is applied in a concentrated manner to a region of the insulating region neighboring the impurity-doped region and a region neighboring the drain pad. As a result, an electric field is concentrated on these regions.

The electric field concentrated on these regions may be stronger than an electric field concentrated on the region in which the gate depletion layer is formed. In this case, the withstand voltage between the source electrode and the drain pad via the insulating region is lower than the withstand voltage between the source electrode and the drain electrode via the impurity-doped region. Thus, as described above, even if the withstand voltage of the region in which the gate depletion layer is formed is secured, there has been a problem that the first semiconductor device is destroyed in the insulating region.

Furthermore, in the second semiconductor device, a withstand voltage via insulating regions between a plurality of elements, between elements and via holes, and between a plurality of via holes may decrease likewise. Thus, there has also been a problem that the second semiconductor device may be destroyed in the insulating regions between those elements and via holes.

In order to address these problems, a dose in ion injection may be increased to increase the withstand voltage of the insulating region. However, when the dose is increased, a leak current increases via the insulating region. This results in problems such as an increase in loss and reliability deterioration when the first and second semiconductor devices are operated at a high frequency.

In view of the above-described problems, an object of the present invention is to provide a semiconductor device which can prevent a breakdown from occurring in the insulating region without increasing a leak current.

According to the present invention, a semiconductor device comprises: a semiconductor substrate; an impurity-doped region on a top surface of the semiconductor substrate; an insulating region provided around the impurity-doped region on the top surface side of the semiconductor substrate through ion injection; a gate electrode on the impurity-doped region; a first electrode and a second electrode provided on the impurity-doped region so as to sandwich the gate electrode; a first pad provided on the insulating region and connected to the gate electrode; a second pad disposed so as to face the first pad across the impurity-doped region on the insulating region and connected to the second electrode; and a conductor provided between the first electrode and the second pad on the insulating region.

The present invention makes it possible to prevent a breakdown from occurring in the insulating region 14 without increasing a leak current.

Other and further objects, features and advantages of the invention will appear more fully from the following description.

DETAILED DESCRIPTION OF THE PREFERRED EMBODIMENTS

Figure 1:
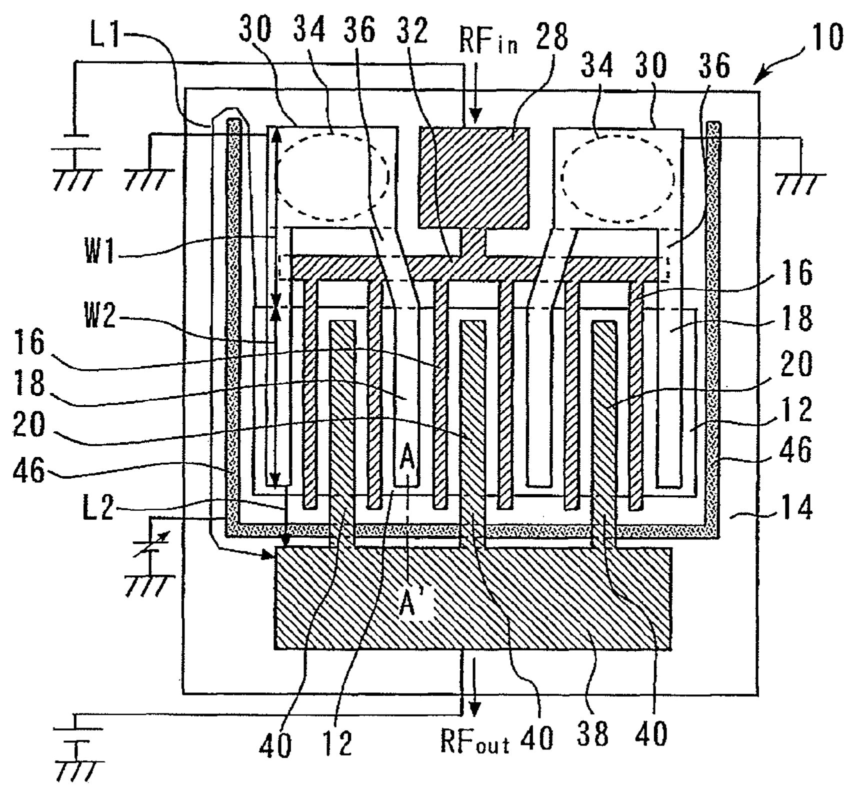
FIG. 1 is a top view of the semiconductor device according to the first embodiment.

Now, embodiments of the present invention will be described with reference to the drawings. Same reference numerals denote same components throughout the drawings, and redundant descriptions will be omitted.

First Embodiment

Figure 2:
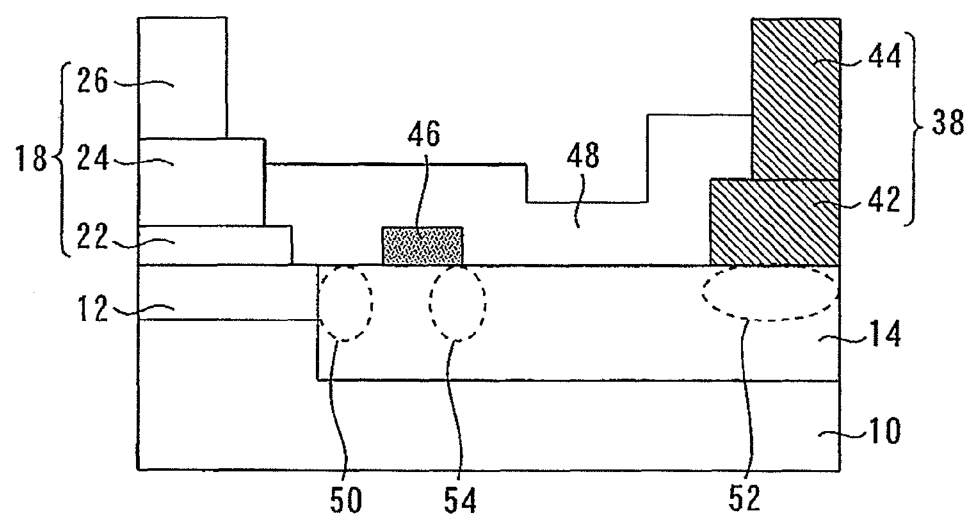
FIG. 2 is a diagram illustrating a cross section along a line A-A' shown in FIG. 1 of the semiconductor device.

Hereinafter, a configuration of a semiconductor device according to a first embodiment will be described. FIG. 1 is a top view of the semiconductor device according to the first embodiment. FIG. 2 is a diagram illustrating a cross section along a line A-A' shown in FIG. 1 of the semiconductor device.

An impurity-doped region 12 is provided on a top surface side of a semi-insulating GaAs substrate 10. The impurity-doped region 12 is an impurity-doped layer formed using an epitaxial method. On the top surface side of the semi-insulating GaAs substrate 10, an insulating region 14 is provided around the impurity-doped region 12. The insulating region 14 is formed by injecting ions such as $B^+$, $H^+$, He, O into the impurity-doped layer formed using an epitaxial method.

A plurality of gate electrodes 16 are provided in the impurity-doped region 12 and a plurality of source electrodes (first electrodes) 18 and a plurality of drain electrodes (second electrodes) 20 are provided so as to sandwich each of the plurality of gate electrodes 16. The gate electrode 16 is a metal making a Schottky contact with the impurity-doped region 12. The source electrode 18 and drain electrode 20 are metals making an ohmic contact with the impurity-doped region 12. The source electrode 18 is provided with a source ohmic electrode 22, a source wiring metal 24 and source wiring plating 26 formed in order on the impurity-doped region 12.

The semiconductor device has a structure in which a plurality of n-type transistors made up of the source electrode 18, gate electrode 16 and drain electrode 20 are arranged in parallel. In the insulating region 14, a gate pad (first pad) 28 and a source pad (third pad) 30 are provided on the side of one end of the impurity-doped region 12. In the insulating region 14, a gate wire 32 is provided between the gate pad 28 and the source pad 30, and the impurity-doped region 12. The gate wire 32 is connected to the gate pad 28, with the direction perpendicular to the longitudinal direction of the drain electrode 20 being its longitudinal direction. The plurality of gate electrodes 16 are each connected to the gate pad 28 via the gate wire 32. The source pad 30 is provided on a via hole 34. The source electrode 18 is connected to the source pad 30 via a source wire 36 disposed above the gate wire 32 via an insulating film or air (neither insulating film nor air is shown).

In the insulating region 14, a drain pad (second pad) 38 is disposed so as to face the gate pad 28 across the impurity-doped region 12. The drain electrode 20 is connected to the drain pad 38 via a drain wire 40. The drain pad 38 is provided with a drain wiring metal 42 and a drain wiring plating 44 formed in order on the insulating region 14.

Furthermore, on the insulating region 14, a conductor 46 is provided between the source electrode 18 and the drain pad 38. The conductor 46 is a metal making a Schottky contact with the insulating region 14. The conductor 46 is provided in a U-shape having an opening on the same side as the side on which the gate pad 28 and the source pad 30 are provided with respect to the impurity-doped region 12 so as to sandwich the impurity-doped region 12, gate pad 28 and source pad 30.

FIG. 1 shows a shortest path from the source electrode 18 to the drain pad 38 traveling the circumference of the conductor 46 and a rectilinear path from the source electrode 18 to the drain pad 38 using an arrow L1 and an arrow L2 respectively. In addition, FIG. 1 also shows a total distance of the source pad 30 and the source wire 36 (normally on the order of 100 μm), and a unit gate width (normally several tens of μm to several hundreds of μm) using an arrow W1 and an arrow W2 respectively. The shortest path from the source electrode 18 to the drain pad 38 traveling the circumference of the conductor 46 is longer than the rectilinear path from the source electrode 18 to the drain pad 38 (normally several tens of μm) by a distance twice the total distance of the source pad 30 and source wire 36 (normally on the order of 100 μm) plus a unit gate width (normally several tens of μm to several hundreds of μm). Furthermore, an insulating film 48 (not shown in FIG. 1) is provided so as to cover the insulating region 14 and conductor 46.

In order for the n-type transistor of the semiconductor device to operate as an amplification element, the source pad 30 is grounded via a grounding terminal (not shown). A negative DC voltage and a positive DC voltage are applied to the gate pad 28 and the drain pad 38 respectively. When the potential of the drain electrode 20 and the drain pad 38 is assumed to be V2 and the withstand voltage between the gate electrode 16 and the drain electrode 20 is assumed to be BVg2, the potential V of the conductor 46 is set so as to satisfy (V2−BVg2)≦V≦V2. (V2−BVg2) is the potential of the gate electrode 16 when the withstand voltage BVg2 is applied between the gate electrode 16 and the drain electrode 20. Therefore, when the withstand voltage BVg2 is applied between the gate electrode 16 and the drain electrode 20, the potential V of the conductor 46 is set to the potential of the gate electrode 16 or above. The potential V of the conductor 46 is set to the potential V2 of the drain pad 38 or below. In this condition, an RF signal is inputted to the gate pad 28 and an amplified RF signal is outputted from the drain pad 38.

Figure 3:
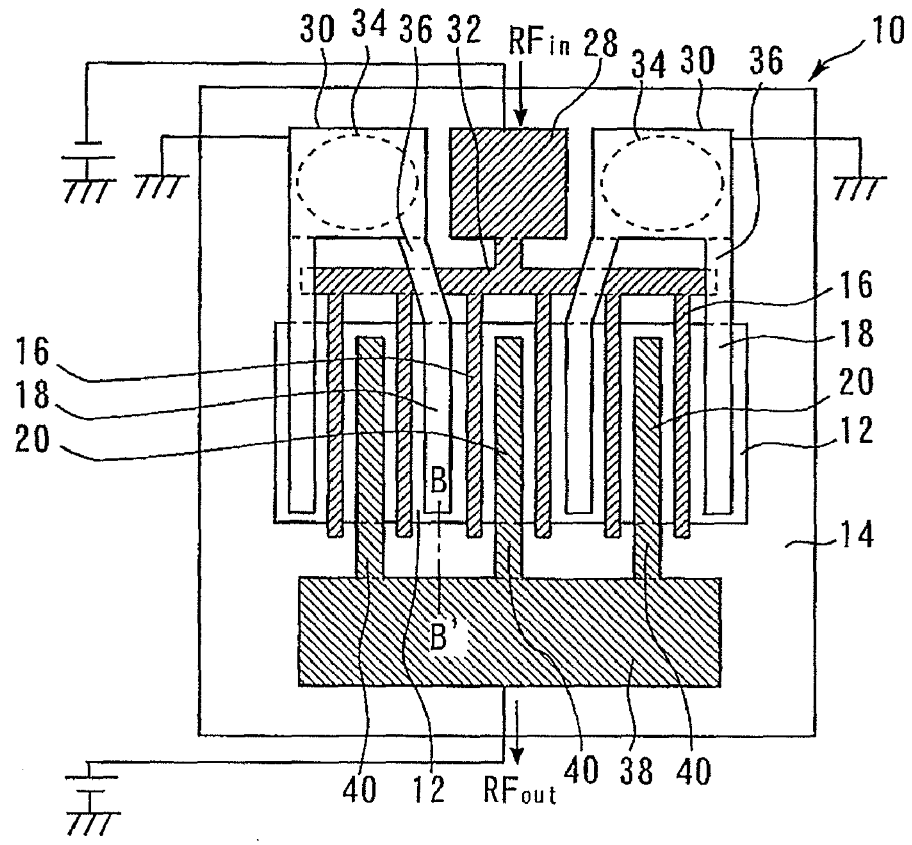
FIG. 3 is a top view of a semiconductor device according to a comparative example.
Figure 4:
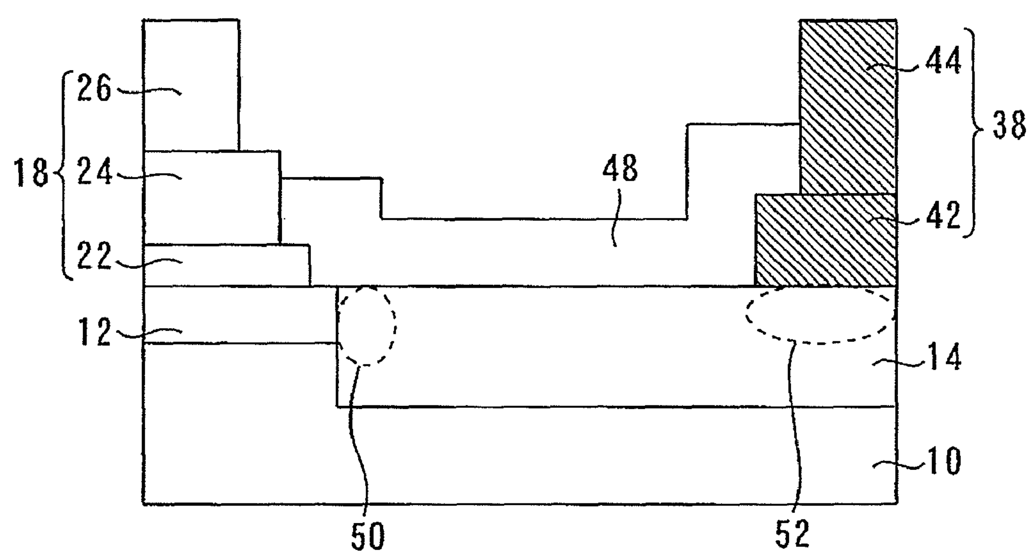
FIG. 4 is a diagram illustrating a cross section along a line B-B' shown in FIG. 3 of the semiconductor device.

Hereinafter, effects of the first embodiment will be described in comparison with a comparative example. FIG. 3 is a top view of a semiconductor device according to a comparative example. FIG. 4 is a diagram illustrating a cross section along a line B-B' shown in FIG. 3 of the semiconductor device. The semiconductor device according to the comparative example has the same configuration as that of the semiconductor device according to the first embodiment except in that the aforementioned conductor 46 is not provided.

When an n-type transistor of a semiconductor device is operated as an amplification element, a higher voltage needs to be applied between the drain electrode 20 and the gate electrode 16 to efficiently exploit higher performance. Therefore, it is important to secure a sufficient withstand voltage between the source electrode 18 and the drain electrode 20 and between the gate electrode 16 and the drain electrode 20 to secure reliability as the amplification element of the semiconductor device.

When a higher voltage is applied between the drain electrode 20 and the gate electrode 16, a gate depletion layer spreads over the impurity-doped region 12. This causes an electric field to be concentrated in the vicinity of the gate electrode 16 in the gate depletion layer. Therefore, in the impurity-doped region 12, it is possible to prevent a voltage applied between the drain electrode 20 and the source electrode 18 from being applied in a concentrated manner to the vicinity of the drain electrode 20 and to the vicinity of the source electrode 18. It is possible to prevent the electric field from concentrating on these locations. Thus, to secure reliability of the semiconductor device as the amplification element, the impurity-doped region 12 needs only to secure the withstand voltage of the region in which the gate depletion layer is formed.

When the semiconductor device is operating while being kept at a room temperature, the insulating region 14 has a sufficient withstand voltage. However, when the temperature of the impurity-doped region 12 rises due to heat generation through the operation of the semiconductor device or when the semiconductor device operates in a high temperature environment, a current may flow between the source electrode 18 and the drain pad 38 via the insulating region 14. In this case, in the semiconductor device according to the comparative example, the voltage applied between the source electrode 18 and the drain pad 38 is applied in a concentrated manner to a first region 50 neighboring the impurity-doped region 12 and a second region 52 neighboring the drain pad 38 in the insulating region 14. As a result, an electric field concentrates on these regions.

Thus, in the semiconductor device according to the comparative example, the electric field concentrated on these regions is stronger than the electric field concentrated on the region in which the gate depletion layer is formed. In this case, the withstand voltage between the source electrode 18 and the drain pad 38 via the insulating region 14 is lower than the withstand voltage between the source electrode 18 and the drain electrode 20 via the impurity-doped region 12. Thus, even if the withstand voltage of the region in which the gate depletion layer is formed is secured, the semiconductor device is destroyed in the insulating region 14 according to the comparative example.

To address this problem, a dose in ion injection may be increased to increase the withstand voltage of the insulating region 14. However, when the dose is increased, a current leaking via the insulating region 14 increases. Thus, when the semiconductor device according to the comparative example is operated at a high frequency, there are problems such as an increase in loss and reliability deterioration.

On the other hand, in the semiconductor device according to the present embodiment, the conductor 46 is provided between the source electrode 18 and the drain pad 38 in the insulating region 14. The potential V of the conductor 46 is set to the potential V2 of the drain pad 38 or below. Therefore, a voltage equal to or below the voltage applied between the source electrode 18 and the drain pad 38 is applied between the source electrode 18 and the conductor 46. Thus, an electric field is also concentrated on a third region 54 below the conductor 46 in the insulating region 14. As a result, it is possible to reduce the concentration of the electric field on the first region 50 and second region 52. Therefore, it is possible to maintain a high withstand voltage between the source electrode 18 and the drain pad 38 via the insulating region 14 compared to the withstand voltage between the source electrode 18 and the drain electrode 20 via the impurity-doped region 12 without increasing the dose.

Furthermore, when the withstand voltage BVg2 is applied between the gate electrode 16 and the drain electrode 20, the potential V of the conductor 46 is set to be equal to or above the potential (V2−BVg2) of the gate electrode 16. Therefore, in this case, the voltage applied between the conductor 46 and the drain electrode 20 via the insulating region 14 is equal to or below the voltage applied between the gate electrode 16 and the drain electrode 20 via the impurity-doped region 12. Therefore, the withstand voltage between the conductor 46 and the drain pad 38 via the insulating region 14 can be increased up to or above the withstand voltage between the gate electrode 16 and the drain electrode 20 via the impurity-doped region 12 without increasing dose.

As described above, it is possible to prevent a breakdown from occurring in the insulating region 14 without increasing a leak current. It is then possible to design a semiconductor device capable of applying a higher voltage between the source electrode 18 and the drain electrode 20.

Furthermore, as described in the explanation of the comparative example, the voltage applied between the source electrode 18 and the drain pad 38 is not equally divided between the source electrode 18 and the drain pad 38. Therefore, even if the distance of the path from the source electrode 18 to the drain pad 38 via the insulating region 14 increases somewhat, the reduction of the withstand voltage between the source electrode 18 and the drain pad 38 is not suppressed so much. However, according to the present embodiment, the shortest path from the source electrode 18 to the drain pad 38 traveling the circumference of the conductor 46 is longer than the rectilinear path (normally several tens of μm) from the source electrode 18 to the drain pad 38 by a distance twice the total distance of the source pad and source wire 36 (normally on the order of 100 μm) plus a unit gate width (normally several tens of μm to several hundreds of μm). Of the path from the source electrode 18 to the drain pad 38, the path where the conductor 46 is not provided has a distance by far longer than that in the case where the conductor 46 is only provided along the line A-A' shown in FIG. 1. This makes it possible to more effectively maintain a high withstand voltage between the source electrode 18 and the drain pad 38 via the insulating region 14.

The conductor 46 is a metal making a Schottky contact with the insulating region 14. Thus, even if a current flows between the source electrode 18 and the drain pad 38 via the insulating region 14, it is possible to prevent a current from flowing into the conductor 46. The conductor 46 can be formed simultaneously with the gate electrode 16 which is a Schottky contact metal.

The conductor 46 may be an ohmic contact metal instead of the metal making a Schottky contact with the insulating region 14. In this case, the effect of being able to form the conductor 46 simultaneously with the source electrode 18 is obtained in addition to the above described effect. Furthermore, the conductor 46 may also be semiconductor of the same conductivity type as the impurity-doped region 12. The aforementioned effect is obtained likewise.

When the conductor 46 is an ohmic contact metal or semiconductor of the same conductivity type as the impurity-doped region 12, if the potential of the source electrode 18 is assumed to be V1 and the potential of the drain electrode 20 is assumed to be V2, the potential V of the conductor 46 may be set so as to satisfy $V1 \leqq V \leqq V2$. By so doing, it is possible to prevent a current from flowing into the conductor 46.

Furthermore, the potential V of the conductor 46 may be set to a potential resulting from adding the potential difference obtained by resistor-dividing the potential difference between the source electrode 18 and the drain pad 38 to the potential of the source electrode 18. In this case, the potential of the conductor 46 approximates to the potential of the drain pad 38, which can more effectively reduce the concentration of the electric field on the second region 52.

The conductor 46 has a main influence on the characteristic of the insulating region 14 between the source electrode 18 and the drain pad 38. The conductor 46 does not have any substantial influence on the characteristic of the n-type transistor of the semiconductor device. However, there may be a minor influence that a stray capacitance of the conductor 46 is added to the capacitance of the n-type transistor.

Second Embodiment

Figure 5:
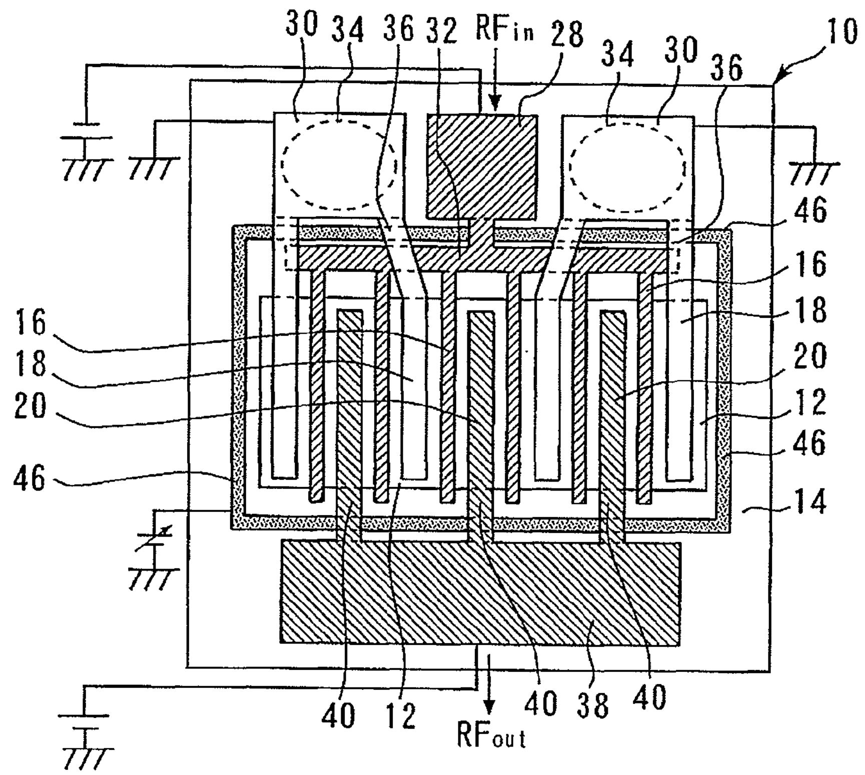
FIG. 5 is a top view of the semiconductor device according to the second embodiment.

Hereinafter, only differences from the first embodiment in the configuration and effect of a semiconductor device according to a second embodiment will be described. FIG. 5 is a top view of the semiconductor device according to the second embodiment. The conductor 46 is provided so as to surround the impurity-doped region 12. That is, the conductor 46 is provided along the entire path from the source electrode 18 to the drain pad 38 via the insulating region 14.

As described above, of the path from the source electrode 18 to the drain pad 38, the semiconductor device according to the first embodiment includes a path where the conductor 46 is not provided. On the other hand, no such path exists in the semiconductor device according to the present embodiment. Thus, it is possible to maintain a high withstand voltage between the conductor 46 and the drain pad 38 along the entire path from the source electrode 18 to the drain pad 38 via the insulating region 14. Therefore, it is possible to prevent a breakdown from occurring in the insulating region 14 more effectively than the first embodiment without increasing a leak current.

Third Embodiment

Figure 6:
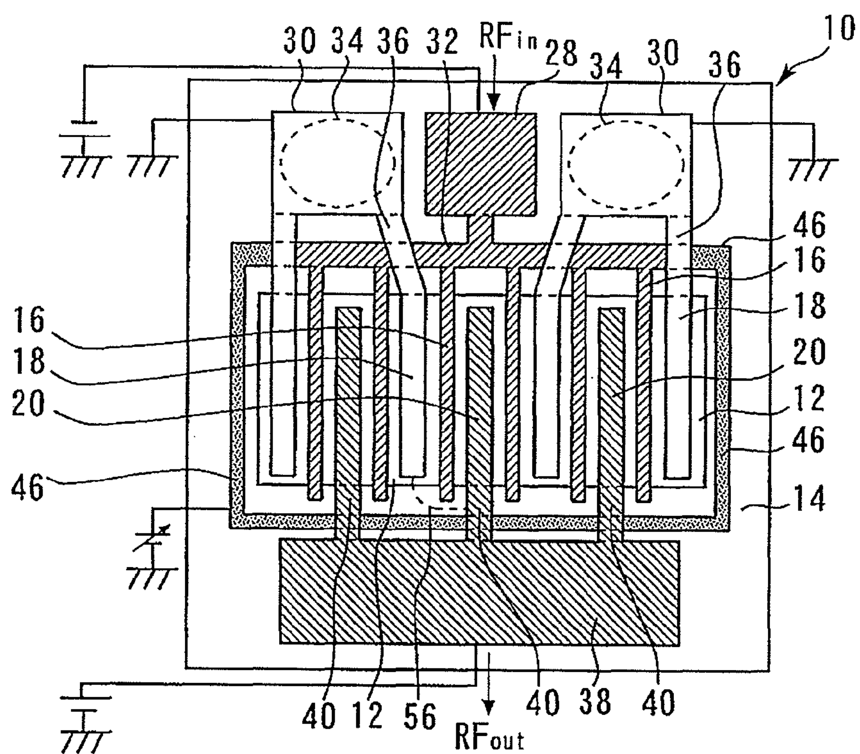
FIG. 6 is a top view of the semiconductor device according to the third embodiment.

Hereinafter, only differences from the first embodiment in the configuration and effect of a semiconductor device according to a third embodiment will be described. FIG. 6 is a top view of the semiconductor device according to the third embodiment. The conductor 46 is connected to both ends of the gate wire 32 and connected to the gate electrode 16 via the gate wire 32. Thus, the potential V of the conductor 46 is set to the potential of the gate electrode 16.

In the semiconductor device according to the first embodiment, the lower the potential of the conductor 46 is set, the greater is the effect of reducing concentration of the electric field on a first region 50. Furthermore, when the potential V of the conductor 46 is set so as to satisfy $(V2-BVg2)—V \leqq V2$ in the first embodiment, when a withstand voltage BVg2 is applied between the gate electrode 16 and the drain electrode 20, the lowest potential that can be set in the conductor 46 is the potential of the gate electrode 16. Thus, when the potential V of the conductor 46 is set to the potential of the gate electrode 16, it is possible to prevent the electric field from concentrating on the first region 50 at the same level at which such a concentration is reduced to a minimum in the first embodiment.

As a result, it is possible to prevent a breakdown from occurring in the insulating region 14 at the same level at which the greatest effect is obtained in the first embodiment without increasing a leak current.

Fourth Embodiment

Figure 7:
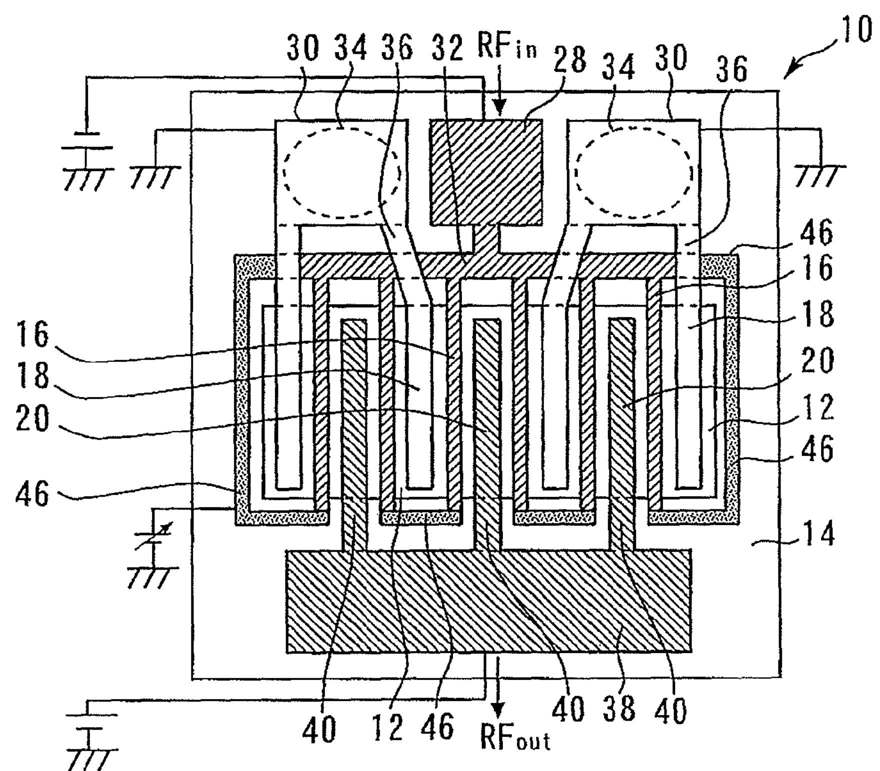
FIG. 7 is a top view of the semiconductor device according to the fourth embodiment.

Hereinafter, only differences from the third embodiment in the configuration and effect of a semiconductor device according to a fourth embodiment will be described. FIG. 7 is a top view of the semiconductor device according to the fourth embodiment. Each of a plurality of pairs of the conductor 46 and gate electrode 16 is integrally formed into a ring shape so as to surround the source electrode 18 together with the gate wire 32.

Thus, of the path between the source electrode 18 and the drain wire 40, a path 56 of the gap shown in FIG. 6 where the conductor 46 is not provided is sealed by the conductor 46 as shown in FIG. 7. This makes it possible also to maintain a high withstand voltage between the source electrode 18 and the drain wire 40 via the insulating region 14. As a result, it is possible to prevent a breakdown from occurring in the insulating region 14 more effectively than the third embodiment without increasing a leak current.

Fifth Embodiment

Figure 8:
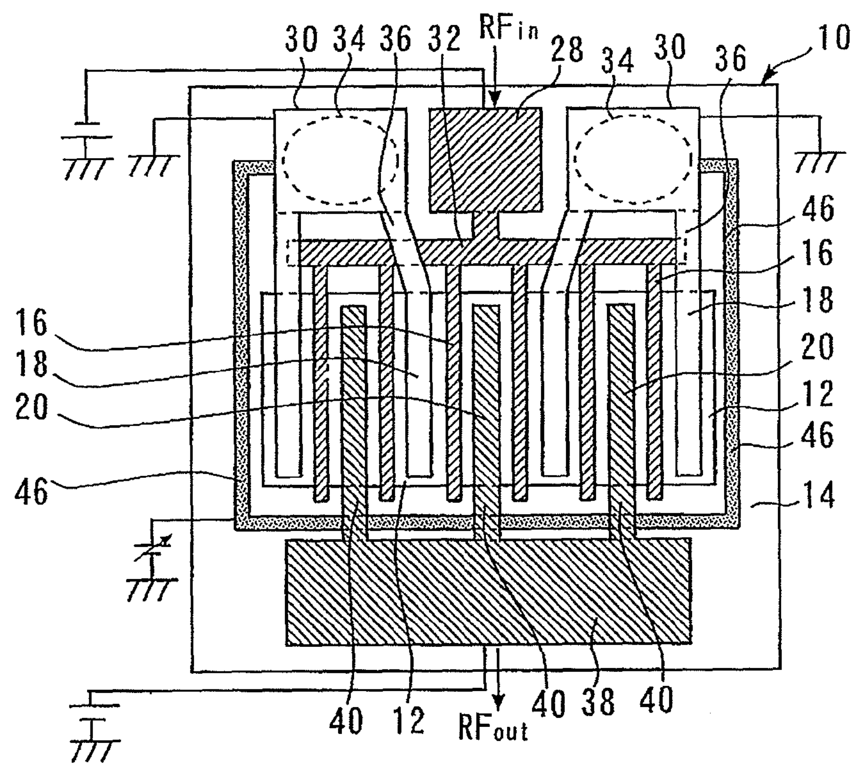
FIG. 8 is a top view of the semiconductor device according to the fifth embodiment.

Hereinafter, only differences from the first embodiment in the configuration and effect of a semiconductor device according to a fifth embodiment will be described. FIG. 8 is a top view of the semiconductor device according to the fifth embodiment. The conductor 46 is connected to the source electrode 18 via the source pad 30. Therefore, the potential of the conductor 46 is set to the potential of the source electrode 18.

In the semiconductor device according to the first embodiment, when the potential of the conductor 46 is set to a potential equal to that of the source electrode 18, it is possible to especially effectively reduce the concentration of the electric field on the first region 50. Therefore, in the present embodiment, it is possible to prevent a breakdown from occurring in the insulating region 14 at the same level at which the effect is particularly obtained in the first embodiment without increasing a leak current.

Sixth Embodiment

Figure 9:
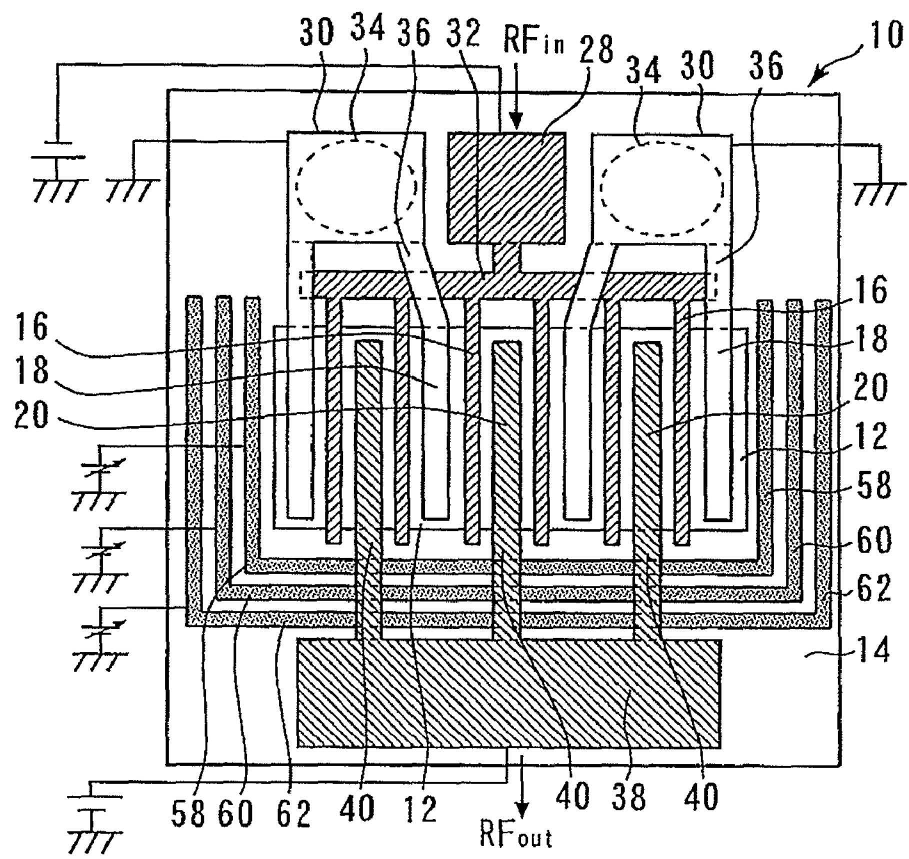
FIG. 9 is a top view of the semiconductor device according to the sixth embodiment.

Hereinafter, only differences from the first embodiment in the configuration and effect of a semiconductor device according to a sixth embodiment will be described. FIG. 9 is a top view of the semiconductor device according to the sixth embodiment.

In the insulating region 14, a first conductor 58, a second conductor 60 and a third conductor 62 are arranged in order from the source electrode 18 toward the drain pad 38. The first conductor 58 is a metal (first metal) making a Schottky contact with the insulating region 14, the second conductor 60 is a metal making an ohmic contact with the insulating region 14 and the third conductor 62 is a metal (second metal) making a Schottky contact with the insulating region 14.

When a current flows between the source electrode 18 and the drain pad 38 via the insulating region 14, the source electrode 18, first conductor 58, second conductor 60, third conductor 62 and drain pad 38 form a cascode connection. Thus, the voltage between the source electrode 18 and the drain pad 38 is divided into equal parts between the source electrode 18 and the second conductor 60 and between the second conductor 60 and the drain pad 38. As a result, in the insulating region 14, an electric field applies to regions below the first conductor 58, second conductor 60 and third conductor 62 uniformly.

Therefore, it is possible to reduce the concentration of the electric field on the first region 50 and second region 52 and prevent the electric field from concentrating on a specific location of the insulating region 14. This makes it possible to maintain a high withstand voltage between the source electrode 18 and the drain pad 38 via the insulating region 14 more effectively than the first embodiment. Therefore, it is possible to prevent a breakdown from occurring in the insulating region 14 more effectively than the first embodiment without increasing a leak current.

The second conductor 60 is not limited to the metal making an ohmic contact with the insulating region 14 but may be semiconductor of the same conductivity type as that of the impurity-doped region 12. The same effect can be obtained in this case, too.

Furthermore, the first conductor 58, second conductor 60 and third conductor 62 may all be metals making a Schottky contact with the insulating region 14 or the conductors may all be metals making an ohmic contact with the insulating region 14. In the insulating region 14, the electric field is concentrated on the regions below the first conductor 58, second conductor 60 and third conductor 62 in this case, too. It is possible to prevent a breakdown from occurring in the insulating region 14 more effectively than the first embodiment without increasing a leak current.

Seventh Embodiment

Figure 10:
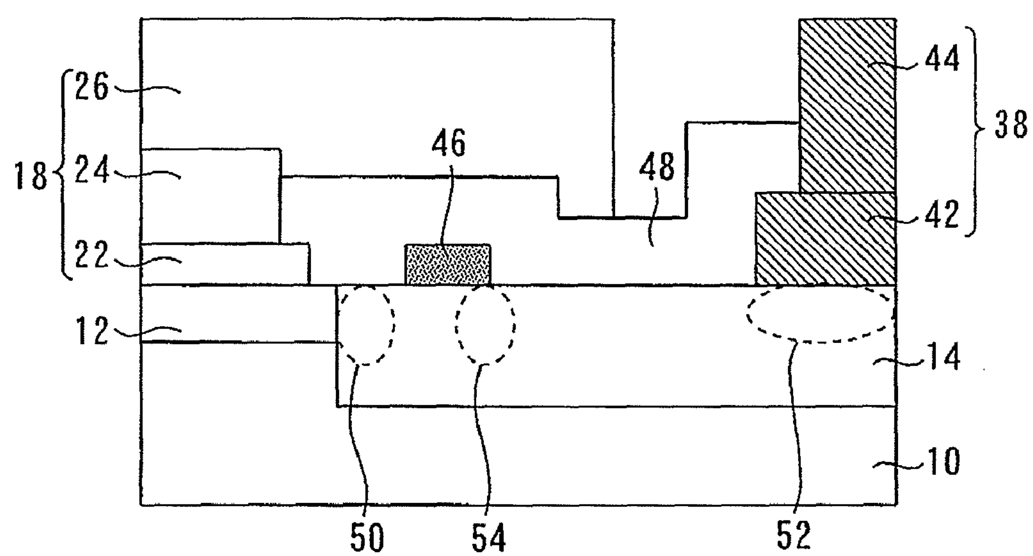
FIG. 10 is a diagram illustrating a cross section along the line A-A' shown in FIG. 1 of the semiconductor device according to the seventh embodiment.

Hereinafter, only differences from the first embodiment in the configuration and effect of a semiconductor device according to a seventh embodiment will be described. FIG. 10 is a diagram illustrating a cross section along the line A-A' shown in FIG. 1 of the semiconductor device according to the seventh embodiment.

The source wiring plating 26 of the source electrode 18 extends to the side closer to the drain pad 38 than the conductor 46 and covers the conductor 46 via the insulating film 48. As described above, in the first embodiment, an electric field is also concentrated on a third region 54 below the conductor 46 in the insulating region 14. In the present embodiment, the electric field concentrated on the third region 54 is reduced due to the influence of the voltage applied to the source electrode 18 covering the conductor 46. Therefore, it is possible to maintain a high withstand voltage between the source electrode 18 and the drain pad 38 via the insulating region 14 more effectively than the first embodiment. Therefore, it is possible to prevent a breakdown from occurring in the insulating region 14 more effectively than the first embodiment without increasing a leak current.

Eighth Embodiment

Figure 11:
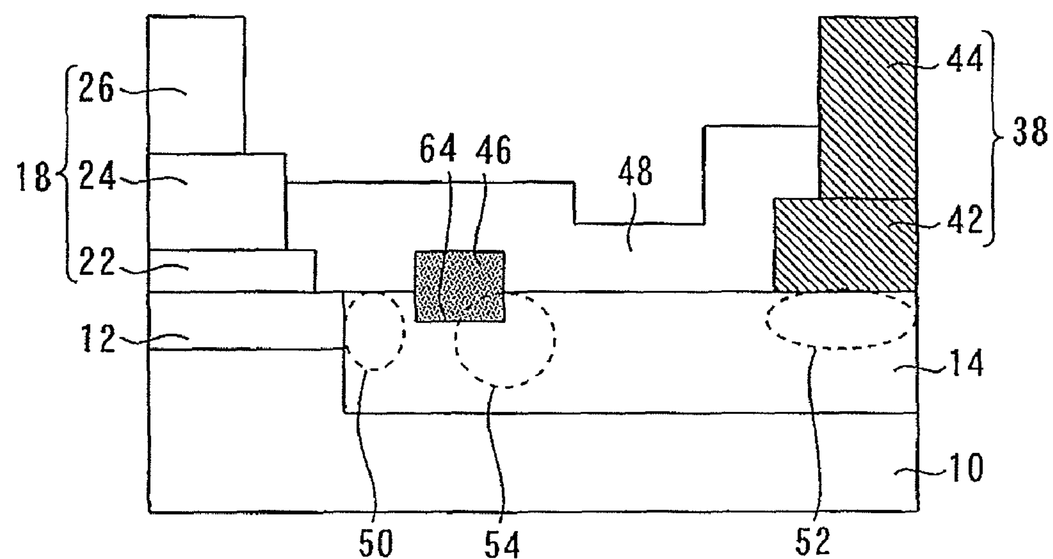
FIG. 11 is a diagram illustrating a cross section along the line A-A' shown in FIG. 1 of the semiconductor device according to the eighth embodiment.

Hereinafter, only differences from the first embodiment in the configuration and effect of a semiconductor device according to an eighth embodiment will be described. FIG. 11 is a diagram illustrating a cross section along the line A-A' shown in FIG. 1 of the semiconductor device according to the eighth embodiment.

The conductor 46 is provided in a dent 64 on the top surface side of the insulating region 14. Thus, the third region 54 below the conductor 46 on which an electric field is concentrated is a range wider than that of the first embodiment. The present embodiment can reduce the concentration of the electric field on the first region 50 and second region 52 more effectively than the first embodiment. It is thereby possible to maintain a high withstand voltage between the source electrode 18 and the drain pad 38 via the insulating region 14 more effectively than the first embodiment. Therefore, it is possible to prevent a breakdown from occurring in the insulating region 14 more effectively than the first embodiment without increasing a leak current.

Ninth Embodiment

Figure 12:
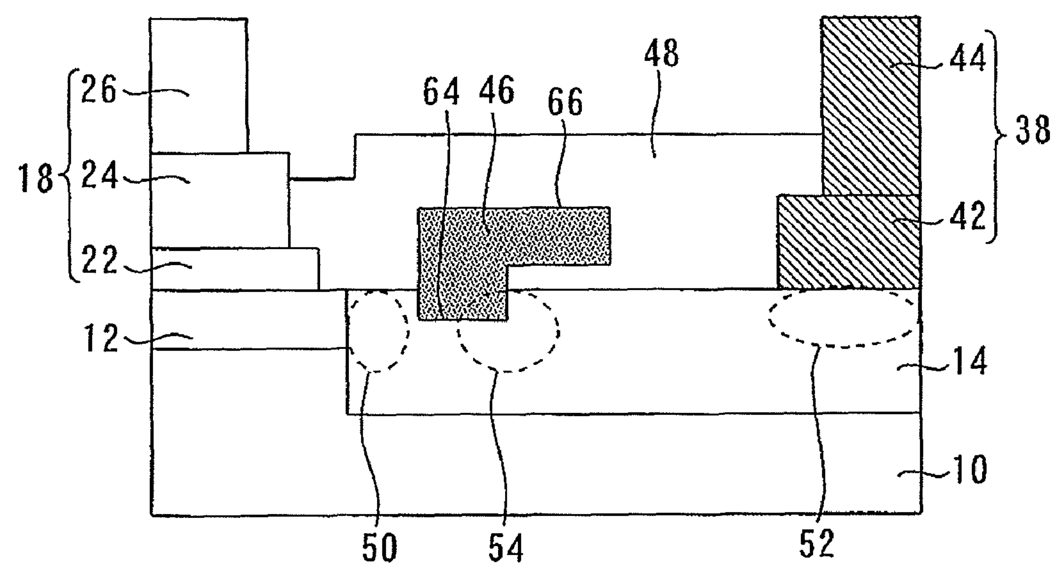
FIG. 12 is a diagram illustrating a cross section along the line A-A' shown in FIG. 1 of the semiconductor device according to the ninth embodiment.

Hereinafter, only the differences from the eighth embodiment in the configuration and effect of a semiconductor device according to a ninth embodiment will be described. FIG. 12 is a diagram illustrating a cross section along the line A-A' shown in FIG. 1 of the semiconductor device according to the ninth embodiment.

The conductor 46 has a protrusion 66 that protrudes toward the drain pad 38 side and is provided so as to be detached from the insulating region 14. An electric field concentrated on the third region 54 can be reduced due to the influence of the voltage applied to this protrusion 66. Thus, it is possible to maintain a high withstand voltage between the source electrode 18 and the drain pad 38 via the insulating region 14 more effectively than the eighth embodiment. Therefore, it is possible to prevent a breakdown from occurring in the insulating region 14 more effectively than the eighth embodiment without increasing a leak current.

The conductor 46 may also have a protrusion that protrudes toward the source electrode 18 side. A higher effect can be obtained in this way when a voltage closer to the drain pad 38 than the source electrode 18 is applied to the conductor 46.

Tenth Embodiment

Figure 13:
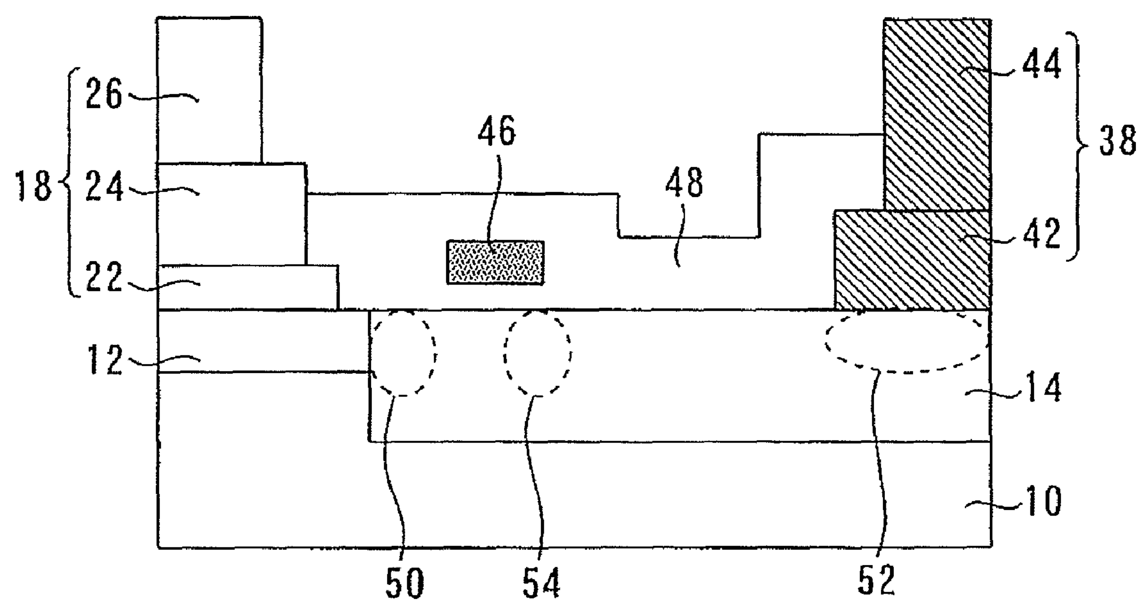
FIG. 13 is a diagram illustrating a cross section along the line A-A' shown in FIG. 1 of the semiconductor device according to the tenth embodiment.

Hereinafter, only differences from the first embodiment in the configuration and effect of a semiconductor device according to a tenth embodiment will be described. FIG. 13 is a diagram illustrating a cross section along the line A-A' shown in FIG. 1 of the semiconductor device according to the tenth embodiment.

The conductor 46 is provided in the insulating region 14 via the insulating film 48. This reduces an electric field concentrated on the third region 54. This makes it possible to prevent an electrical breakdown from occurring in the insulating region 14 due to the electric field concentrated on the third region 54. It is thereby possible to maintain a high withstand voltage between the source electrode 18 and the drain pad 38 via the insulating region 14 more effectively than the first embodiment. Therefore, it is possible to prevent a breakdown from occurring in the insulating region 14 more effectively than the first embodiment without increasing a leak current.

Eleventh Embodiment

Figure 14:
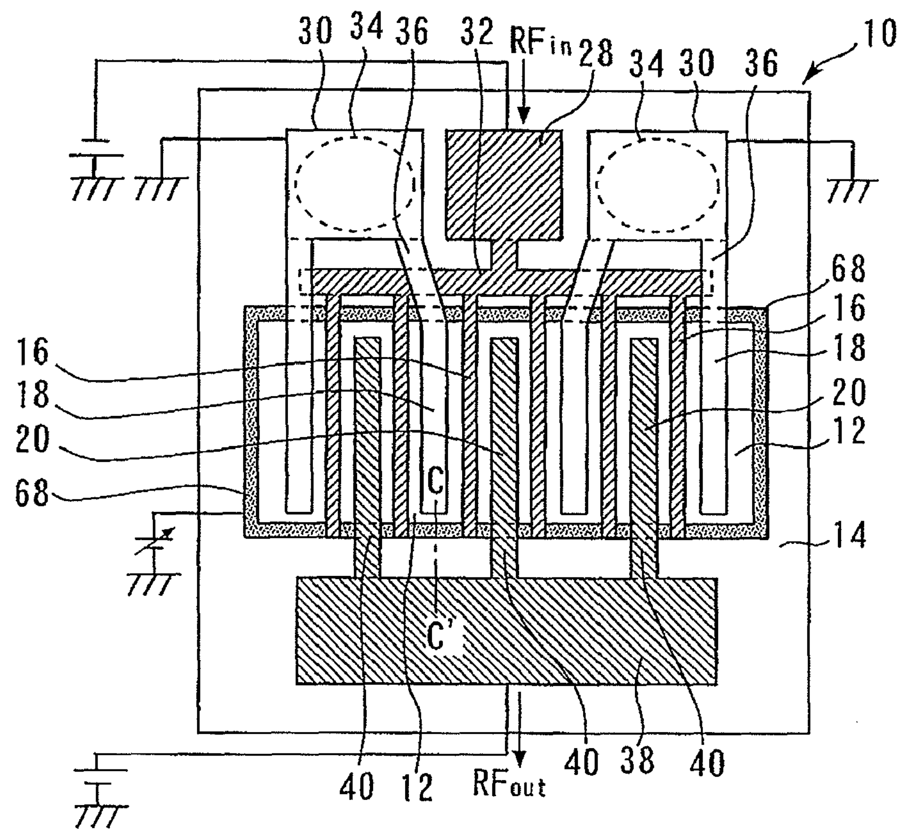
FIG. 14 is a top view of the semiconductor device according to the eleventh embodiment.
Figure 15:
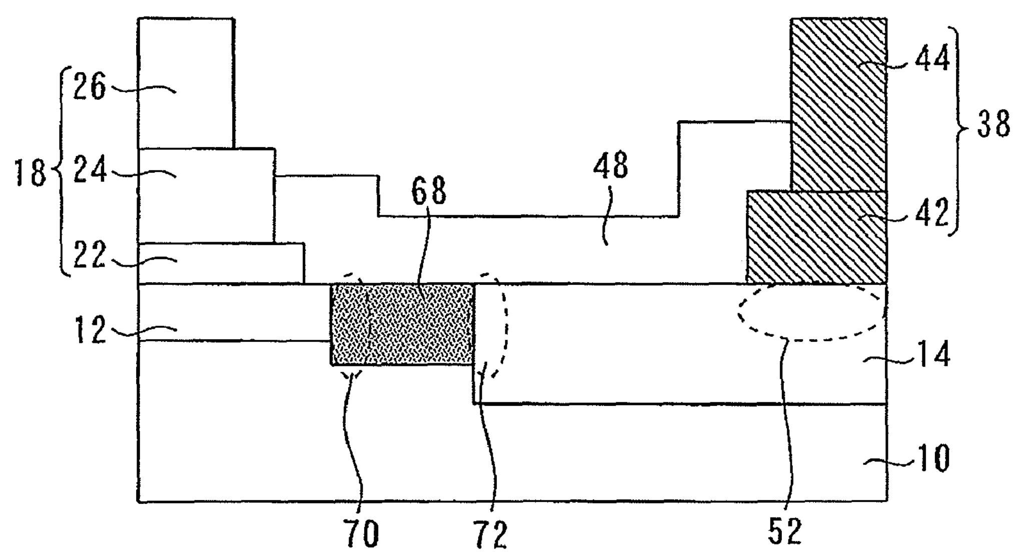
FIG. 15 is a diagram illustrating a cross section along a line C-C' shown in FIG. 14 of the semiconductor device.

Hereinafter, only differences from the first embodiment in the configuration of a semiconductor device according to an eleventh embodiment will be described. FIG. 14 is a top view of the semiconductor device according to the eleventh embodiment. FIG. 15 is a diagram illustrating a cross section along a line C-C' shown in FIG. 14 of the semiconductor device.

Unlike the semiconductor device according to the first embodiment, the conductor 46 is not provided between the source electrode 18 and the drain pad 38 in the insulating region 14. A semiconductor region 68 is provided between the impurity-doped region 12 and the insulating region 14 so as to surround the impurity-doped region 12 on the top surface side of the semi-insulating GaAs substrate 10. The semiconductor region 68 is provided in a position sandwiched between the source electrode 18 and the drain pad 38. Furthermore, the semiconductor region 68 is of the same conductivity type as the impurity-doped region 12 and has impurity concentration 1/10 of that of the impurity-doped region 12. Thus, the semiconductor region 68 is set to a potential higher than the potential of the source electrode 18 and lower than the potential of the drain pad 38.

Hereinafter, the effect of the eleventh embodiment will be described in comparison with the aforementioned comparative example.

In the semiconductor device according to the comparative example, the semiconductor region 68 is not provided between the impurity-doped region 12 and the insulating region 14 as shown in FIG. 4. An electric field is concentrated on the first region 50 and second region 52 in the insulating region 14. On the other hand, in the semiconductor device according to the present embodiment, the semiconductor region 68 is set to a potential higher than the potential of the source electrode 18 and lower than the potential of the drain pad 38. Therefore, the voltage applied to the first region 50 in the comparative example is applied by being divided into two parts; a fourth region 70 neighboring the impurity-doped region 12 of the semiconductor region 68 and a fifth region 72 neighboring the semiconductor region 68 of the insulating region 14.

Therefore, it is possible to reduce the concentration of the electric field in the insulating region 14. It is possible to maintain a higher withstand voltage between the source electrode 18 and the drain pad 38 via the insulating region 14 than the withstand voltage between the source electrode 18 and the drain electrode 20 via the impurity-doped region 12. As described above, it is possible to prevent a breakdown from occurring in the insulating region 14 without increasing a leak current.

Twelfth Embodiment

Figure 16:
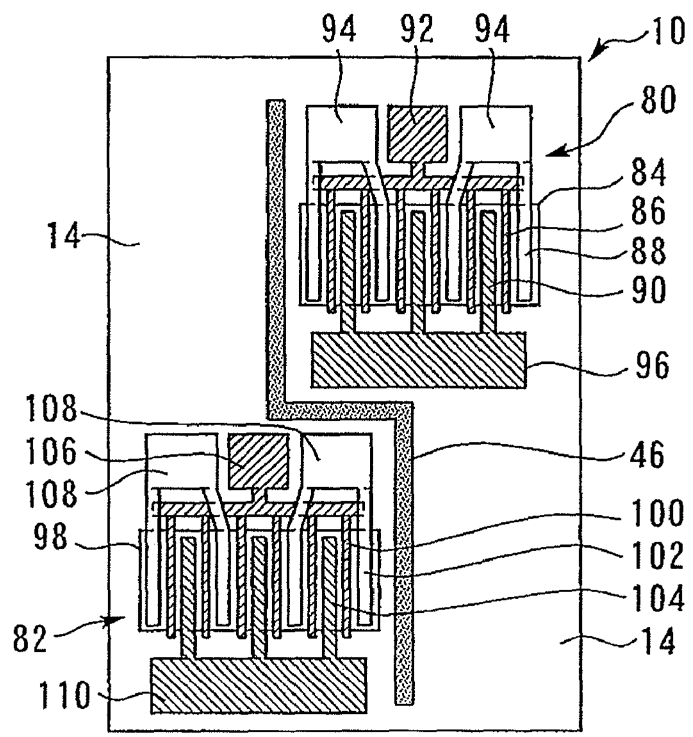
FIG. 16 is a top view of the semiconductor device according to the twelfth embodiment.

Hereinafter, the configuration of a semiconductor device according to a twelfth embodiment will be described. FIG. 16 is a top view of the semiconductor device according to the twelfth embodiment.

A first n-type transistor (first element) 80 and a second n-type transistor (second element) 82 are directly provided on the semi-insulating GaAs substrate 10. The insulating region 14 that electrically separates the first n-type transistor 80 from the second n-type transistor 82 is provided on the top surface side of the semi-insulating GaAs substrate 10 through ion injection.

The first n-type transistor 80 includes a first impurity-doped region 84, a first gate electrode 86, a first source electrode 88 and a first drain electrode 90 provided on the top surface side of the semi-insulating GaAs substrate 10. Furthermore, the first n-type transistor 80 includes a first gate pad 92, a first source pad 94 and a first drain pad 96.

The first gate electrode 86 is directly provided on the first impurity-doped region 84. The first source electrode 88 and first drain electrode 90 are directly provided on the first impurity-doped region 84 so as to sandwich the first gate electrode 86. The first gate pad 92, first source pad 94 and first drain pad 96 are directly provided on the insulating region 14. The first gate electrode 86, first source electrode 88 and first drain electrode 90 are connected to the first gate pad 92, first source pad 94 and first drain pad 96 respectively.

Furthermore, the second n-type transistor 82 includes a second impurity-doped region 98, a second gate electrode 100, a second source electrode 102 and a second drain electrode 104 provided on the top surface side of the semi-insulating GaAs substrate 10. Furthermore, the second n-type transistor 82 includes a second gate pad 106, a second source pad 108 and a second drain pad 110.

The second gate electrode 100 is directly provided on the second impurity-doped region 98. The second source electrode 102 and second drain electrode 104 are directly provided on the second impurity-doped region 98 so as to sandwich the second gate electrode 100. The second gate pad 106, second source pad 108 and second drain pad 110 are directly provided on the insulating region 14. The second gate electrode 100, second source electrode 102 and second drain electrode 104 are connected to the second gate pad 106, second source pad 108 and second drain pad 110 respectively.

Furthermore, the conductor 46 is provided between the first n-type transistor 80 and the second n-type transistor 82 in the insulating region 14. The conductor 46 is provided between the first drain electrode 90 or the first drain pad 96 and the second source electrode 102 or the second source pad 108.

When the first n-type transistor 80 and second n-type transistor 82 are operated as amplification elements, the first source pad 94 and second source pad 108 are grounded. Furthermore, a negative DC voltage is applied to the first gate pad 92 and second gate pad 106. A positive DC voltage is applied to the first drain pad 96 and second drain pad 110. In this condition, an RF signal is inputted to the first gate pad 92 and second gate pad 106 and an amplified RF signal is outputted from the first drain pad 96 and second drain pad 110.

As described above, the conductor 46 is provided between the first drain electrode 90 and the first drain pad 96, and the second source electrode 102 and second source pad 108. Thus, a voltage equal to or below the voltage applied between the second source electrode 102 and the second source pad 108, and the first drain electrode 90 and first drain pad 96 is applied between the second source electrode 102 and the second source pad 108, and the conductor 46.

In this way, the electric field is concentrated on the region below the conductor 46 in the insulating region 14. Therefore, it is possible to reduce the electric field concentrated on the region neighboring the first drain electrode 90, first drain pad 96, second source electrode 102 and second source pad 108 in the insulating region 14. Therefore, it is possible to maintain a high withstand voltage between the second source electrode 102 and the second source pad 108, and the first drain electrode 90 and first drain pad 96 via the insulating region 14.

As described above, it is possible to prevent a breakdown from occurring in the insulating region 14 without increasing a leak current. Furthermore, it is possible to arrange a plurality of neighboring transistors such as the first n-type transistor 80 and second n-type transistor 82 close to each other. Thus, the size of the semiconductor device can be reduced.

A modification example of the present embodiment will be described below. FIG. 17 to FIG. 23 are top views of the semiconductor device according to modification examples of the twelfth embodiment.

Figure 17:
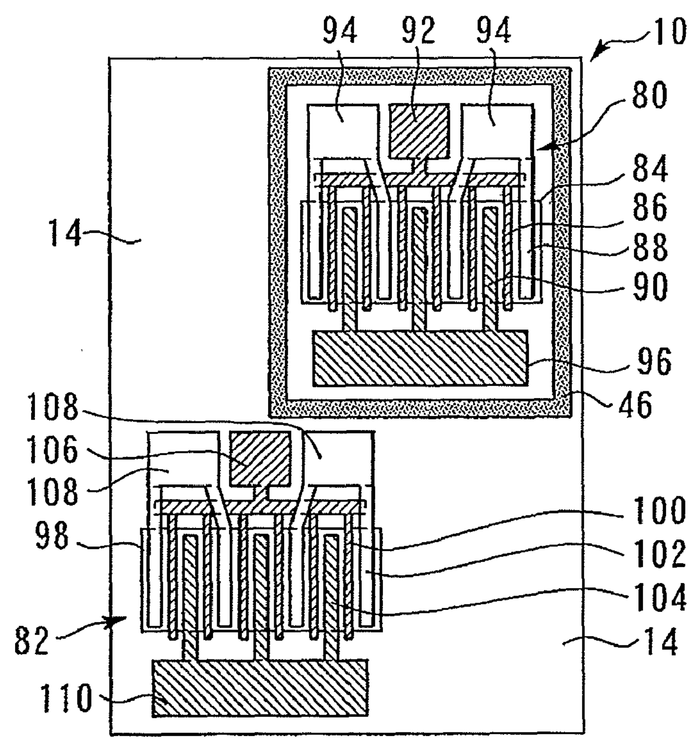
FIG. 17 to FIG. 23 are top views of the semiconductor device according to modification examples of the twelfth embodiment.

In the modification example shown in FIG. 17, the conductor 46 is provided so as to surround the first n-type transistor 80. The conductor 46 is provided in the entire path from the second source electrode 102 and second source pad 108, to the first drain electrode 90 and first drain pad 96 via the insulating region 14. Thus, a higher effect can be obtained.

Figure 18:
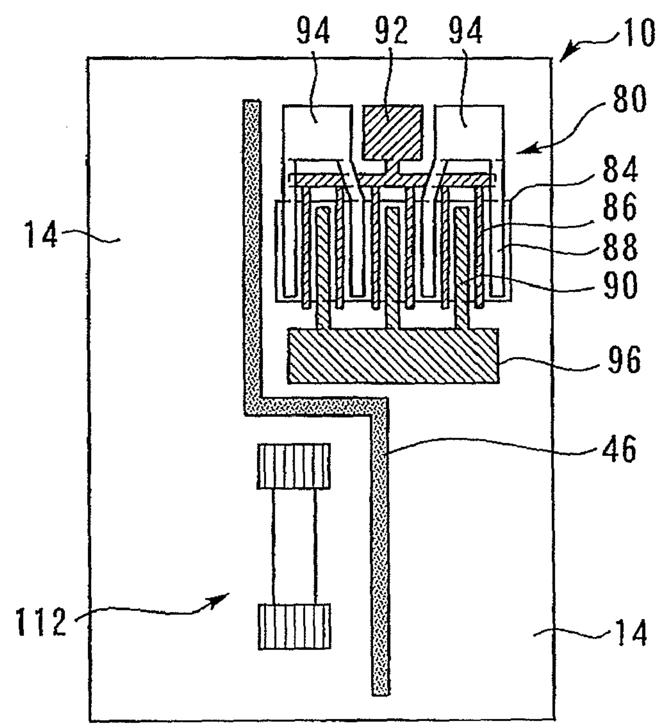

In the modification example shown in FIG. 18, a resistance element 112 is directly provided on the semi-insulating GaAs substrate 10 instead of the second n-type transistor 82. The conductor 46 is provided between the first n-type transistor 80 and the resistance element 112 in the insulating region 14. This makes it possible to reduce an electric field concentrated on the region neighboring the first drain electrode 90, first drain pad 96 and resistance element 112 in the insulating region 14. Thus, it is possible to maintain a high withstand voltage between the first drain electrode 90 and the first drain pad 96, and resistance element 112 via the insulating region 14. Thus, a similar effect can be obtained.

Figure 19:
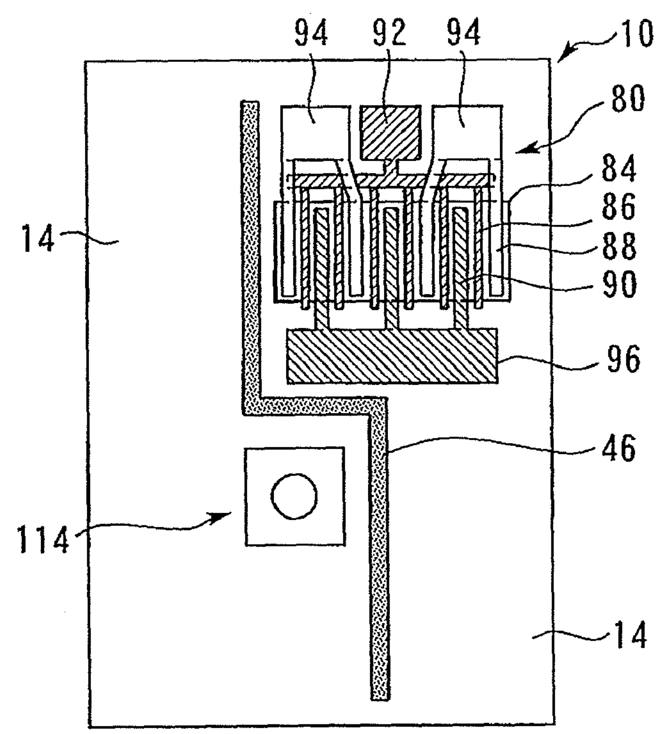

In a modification example shown in FIG. 19, a via hole 114 is directly provided on the semi-insulating GaAs substrate 10 instead of the second n-type transistor 82. The conductor 46 is provided between the first n-type transistor 80 and the via hole 114 in the insulating region 14. This makes it possible to reduce an electric field concentrated on the region neighboring the first drain electrode 90, first drain pad 96 and via hole 114 in the insulating region 14. Therefore, it is possible to maintain a high withstand voltage between the first drain electrode 90 and the first drain pad 96, and via hole 114 via the insulating region 14. Thus, a similar effect can be obtained.

Figure 20:
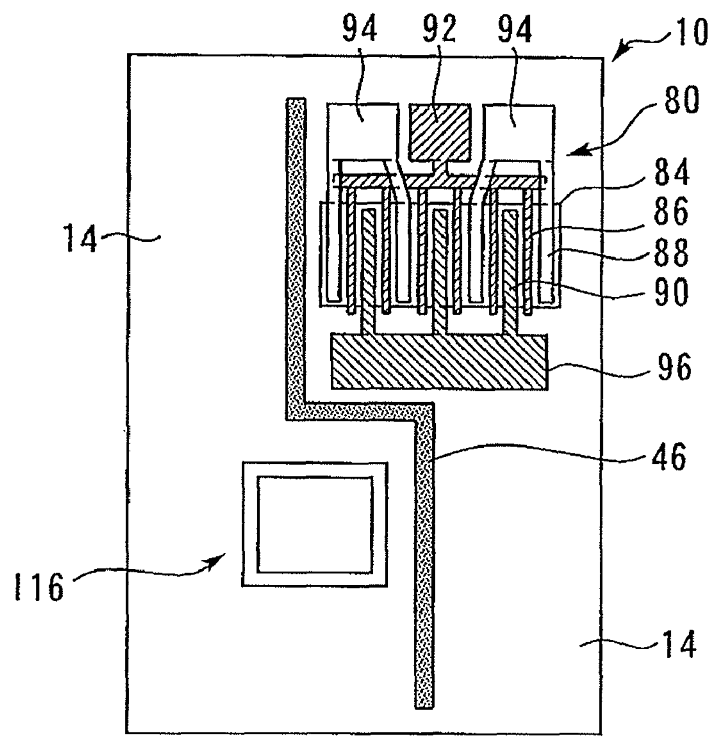

In a modification example shown in FIG. 20, a MIM capacitor 116 is directly provided on the semi-insulating GaAs substrate 10 instead of the second n-type transistor 82. The conductor 46 is provided between the first n-type transistor 80 and the MIM capacitor 116 in the insulating region 14. This makes it possible to reduce an electric field concentrated on the region neighboring the first drain electrode 90, first drain pad 96 and MIM capacitor 116 in the insulating region 14. It is thereby possible to maintain a high withstand voltage between the first drain electrode 90 and the first drain pad 96, and MIM capacitor 116 via the insulating region 14. Therefore, a similar effect can be obtained.

Figure 21:
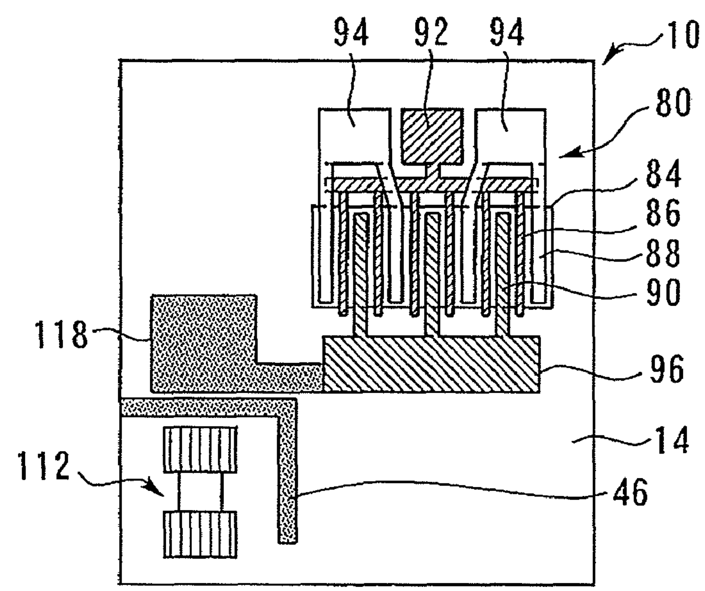

In a modification example shown in FIG. 21, a third drain pad 118 is directly provided on the semi-insulating GaAs substrate 10 outside the first n-type transistor 80. The third drain pad 118 is connected to the first drain pad 96. The resistance element 112 is directly provided on the semi-insulating GaAs substrate 10. The conductor 46 is provided between the third drain pad 118 and the resistance element 112 in the insulating region 14. This makes it possible to maintain a high withstand voltage between the third drain pad 118 and the resistance element 112 via the insulating region 14. Thus, a similar effect can be obtained.

Figure 22:
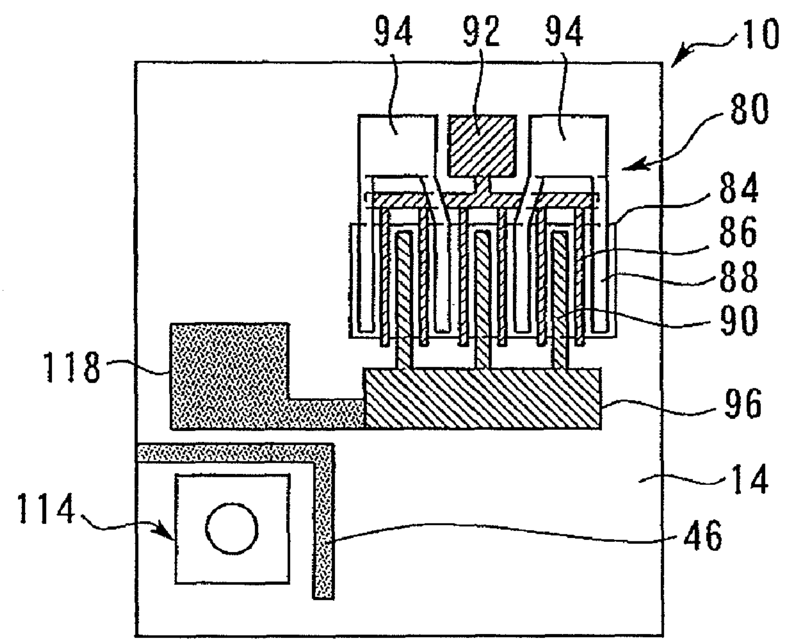

In a modification example shown in FIG. 22, the third drain pad 118 is directly provided on the semi-insulating GaAs substrate 10 outside the first n-type transistor 80. The third drain pad 118 is connected to the first drain pad 96. The via hole 114 is directly provided on the semi-insulating GaAs substrate 10. The conductor 46 is provided between the third drain pad 118 and via hole 114 in the insulating region 14. This makes it possible to maintain a high withstand voltage between the third drain pad 118 and the via hole 114 via the insulating region 14. Thus, a similar effect can be obtained.

Figure 23:
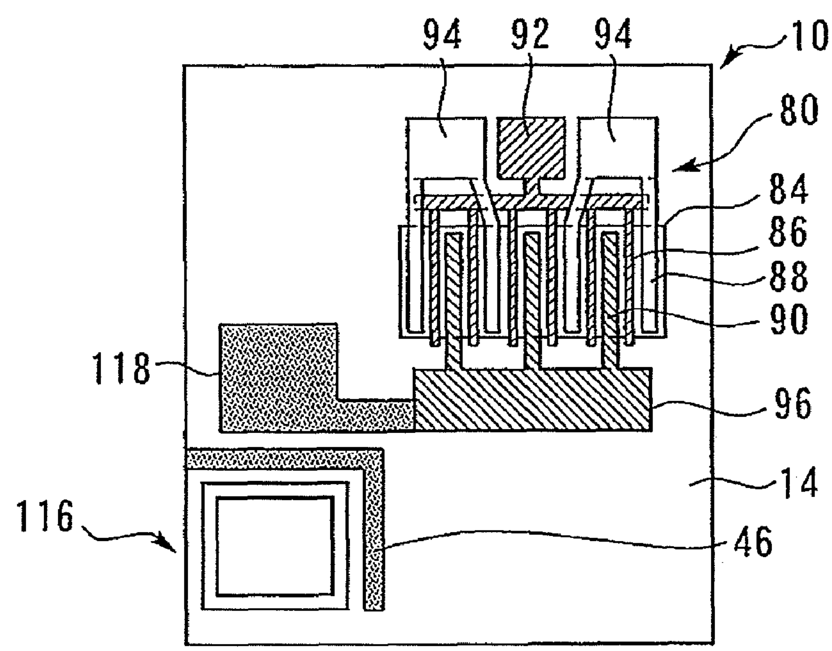

In a modification example shown in FIG. 23, the third drain pad 118 is directly provided on the semi-insulating GaAs substrate 10 outside the first n-type transistor 80. The third drain pad 118 is connected to the first drain pad 96. The MIM capacitor 116 is directly provided on the semi-insulating GaAs substrate 10. The conductor 46 is provided between the third drain pad 118 and the MIM capacitor 116 in the insulating region 14. This makes it possible to maintain a high withstand voltage between the third drain pad 118 and the MIM capacitor 116 via the insulating region 14. Thus, a similar effect can be obtained.

Furthermore, as a modification example, a semiconductor device with a resistance element or MIM capacitor directly provided on the semi-insulating GaAs substrate 10 instead of the first n-type transistor 80 is also possible (not shown). In this modification example, the conductor 46 is provided between the resistance element or MIM capacitor and the second n-type transistor 82 in the insulating region 14. This makes it possible to reduce an electric field concentrated on the region neighboring the resistance element or MIM capacitor, second source electrode 102 and second source pad 108. It is thereby possible to maintain a high withstand voltage between the resistance element or MIM capacitor, second source electrode 102 and second source pad 108 via the insulating region 14. Thus, a similar effect can be obtained.

Furthermore, as a modification example, a semiconductor device may also be considered in which a first resistance element or first MIM capacitor is directly provided on the semi-insulating GaAs substrate 10 instead of the first n-type transistor 80 and a second resistance element or second MIM capacitor is directly provided on the semi-insulating GaAs substrate 10 instead of the second n-type transistor 82 (not shown). In this modification example, the conductor 46 is provided between the first resistance element or first MIM capacitor and second resistance element or second MIM capacitor in the insulating region 14. This makes it possible to reduce an electric field concentrated on the region neighboring the first resistance element or first MIM capacitor and the region neighboring the second resistance element or second MIM capacitor. Thus, it is possible to maintain a high withstand voltage between the first resistance element or first MIM capacitor and second resistance element or second MIM capacitor via the insulating region 14. Thus, a similar effect can be obtained. Furthermore, in this modification example, a via hole may also be directly provided on the semi-insulating GaAs substrate 10 instead of the second resistance element or second MIM capacitor. A similar effect can thereby be obtained.

Thirteenth Embodiment

Figure 24:
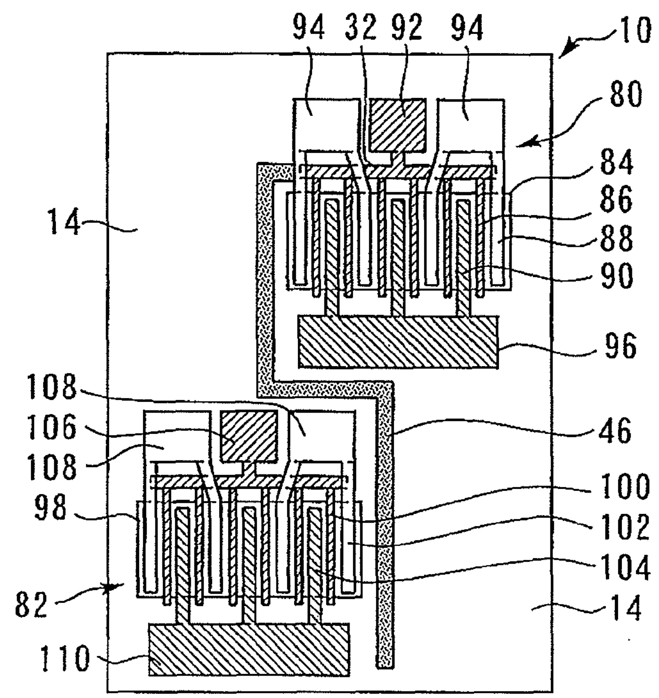
FIG. 24 is a top view of the semiconductor device according to the thirteenth embodiment.

Hereinafter, only differences from the twelfth embodiment in the configuration and effect of a semiconductor device according to a thirteenth embodiment will be described. FIG. 24 is a top view of the semiconductor device according to the thirteenth embodiment. The conductor 46 is provided so as to be connected to the first gate electrode 86 via the gate wire 32. Therefore, the potential V of the conductor 46 is set to the potential of the gate electrode 16 and can be set to be lower than that in the twelfth embodiment.

The lower the potential of the conductor 46 is set, the greater is the effect of reducing an electric field concentrated on the region neighboring a second source electrode 102 and second source pad 108 in the insulating region 14. Therefore, it is possible to maintain a high withstand voltage between the second source electrode 102 and the second source pad 108, and the first drain electrode 90 and first drain pad 96 via the insulating region 14 more than that in the twelfth embodiment. Therefore, it is possible to prevent a breakdown from occurring in the insulating region 14 without increasing a leak current more effectively than that in the twelfth embodiment. Furthermore, it is possible to arrange a plurality of neighboring transistors closer to each other than that in the twelfth embodiment. Thus, it possible to make the size of the semiconductor device smaller than that in the twelfth embodiment.

Figure 25:
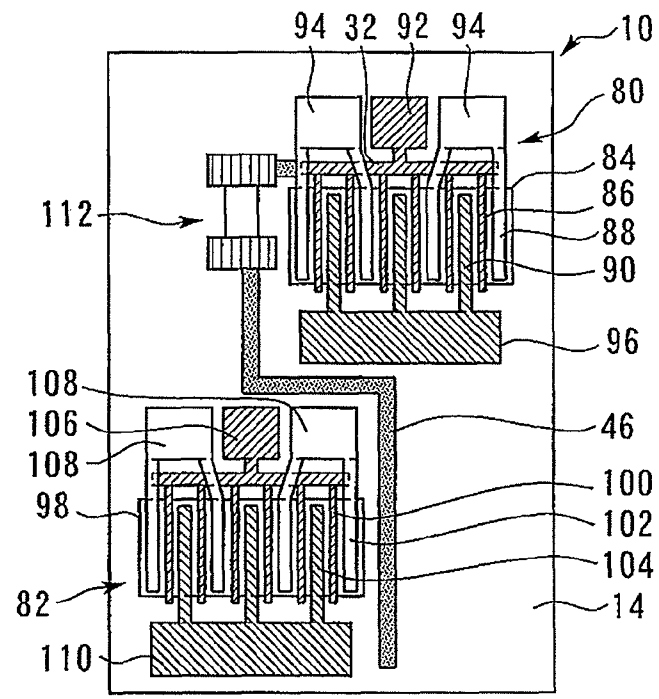
FIG. 25 is a top view of a semiconductor device according to a modification example of the thirteenth embodiment.

FIG. 25 is a top view of a semiconductor device according to a modification example of the thirteenth embodiment. The conductor 46 is provided with the resistance element 112 and the conductor 46 is connected to the first gate electrode 86 via the resistance element 112. In this case, it is possible to prevent an RF signal inputted to the first gate pad 92 from being inputted to the conductor 46 side. Thus, when the first n-type transistor 80 operates at a high frequency, the voltage of the conductor 46 is kept constant. Therefore, it is possible to maintain a high withstand voltage between the second source electrode 102 and the second source pad 108, first drain electrode 90 and first drain pad 96 via the insulating region 14 more stably than that in the twelfth embodiment. Furthermore, in this modification example, a similar effect can be obtained even if an inductor is provided instead of the resistance element 112.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2009-164450, filed on Jul. 13, 2009 including specification, claims, drawings and summary, on which the Convention priority of the present application is based, are incorporated herein by reference in its entirety.

What is claimed is:

1. A semiconductor device comprising:

a semiconductor substrate;

an impurity-doped region at a top surface of the semiconductor substrate;

an insulating region located around the impurity-doped region at the top surface of the semiconductor substrate and produced by ion implantation;

a gate electrode on the impurity-doped region;

a first electrode and a second electrode located on the impurity-doped region and sandwiching the gate electrode;

a first pad located on the insulating region and connected to the gate electrode:

a second pad facing the first pad across the impurity-doped region, on the insulating region, and connected to the second electrode; and a conductor located between the first electrode and the second pad on the insulating region.

2. The semiconductor device according to claim 1, wherein the conductor is a metal making a Schottky contact with the insulating region.

3. The semiconductor device according to claim 1, wherein the conductor is a metal making an ohmic contact with the insulating region.

4. The semiconductor device according to claim 1, wherein the conductor is a semiconductor having the same conductivity type as the impurity-doped region.

5. The semiconductor device according to claim 2, wherein potential of the second electrode is V2, withstand voltage between the gate electrode and the second electrode is BVg2, and potential V of the conductor is set to satisfy $(V2-BVg2) \leqq V \leqq V2$.

6. The semiconductor device according to claim 3, wherein potential of the first electrode is V1, potential of the second electrode is V2, and potential V of the conductor is set to satisfy $V1 \leqq V \leqq V2$.

7. The semiconductor device according to claim 2, wherein potential of the conductor is set to a potential resulting from adding potential difference obtained by resistor-dividing potential difference between the first electrode and the second pad to potential of the first electrode.

8. The semiconductor device according to claim 1, wherein the conductor surrounds the impurity-doped region.

9. The semiconductor device according to claim 1, further comprising a third pad, located on the same side where the first pad is located with respect to the impurity-doped region, on the insulating region, wherein the conductor has a U-shape having an opening located on the same side as the side on which the first pad is located, with respect to the impurity-doped region, sandwiching the impurity-doped region, the first pad, and the third pad.

10. The semiconductor device according to claim 2, wherein the conductor is connected to the gate electrode.

11. The semiconductor device according to claim 10, wherein the conductor and the gate electrode integrally form a ring shape surrounding the first electrode.

12. The semiconductor device according to claim 2, wherein the conductor is connected to the first electrode.

13. The semiconductor device according to claim 1, wherein the conductor includes a plurality of conductors arranged in order from the first electrode toward the second pad.

14. The semiconductor device according to claim 13, wherein the plurality of conductors includes a first conductor, a second conductor, and a third conductor, arranged in that order from the first electrode toward the second pad, the first conductor is a metal making a Schottky contact with the insulating region, the second conductor is a metal making an ohmic contact with the insulating region or a semiconductor having the same conductivity type as the impurity-doped region, and the third conductor is a metal making a Schottky contact with the insulating region.

15. The semiconductor device according to claim 1, further comprising an insulating film covering the conductor on the insulating region, wherein the first electrode covers the conductor, with the insulating film between the first electrode and the conductor.

16. The semiconductor device according to claim 1, wherein the conductor is located in a dent in a top surface of the insulating region.

17. The semiconductor device according to claim 1, wherein the conductor has a protrusion that protrudes toward the second pad or the first electrode and is provided to be detachable from the insulating region.

18. The semiconductor device according to claim 1, further comprising an insulating film on the insulating region, wherein the conductor is located on the insulating region with the insulating film between the conductor and the insulating region.

* * * * *